United States Patent
Yoshizawa et al.

(10) Patent No.: US 9,331,675 B2
(45) Date of Patent: May 3, 2016

(54) TRANSMISSION DRIVE CIRCUIT AND SEMICONDUCTOR INTEGRATED CIRCUIT DEVICE

(71) Applicant: HITACHI, LTD., Chiyoda-ku, Tokyo (JP)

(72) Inventors: Hiroyasu Yoshizawa, Tokyo (JP); Satoshi Hanazawa, Tokyo (JP); Nao Miyamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/811,835

(22) Filed: Jul. 29, 2015

(65) Prior Publication Data

US 2016/0036418 A1   Feb. 4, 2016

(30) Foreign Application Priority Data

Aug. 4, 2014   (JP) .................................. 2014-158369

(51) Int. Cl.
| | |
|---|---|
| H03B 1/00 | (2006.01) |
| H03K 3/00 | (2006.01) |
| H03K 3/013 | (2006.01) |
| H03K 17/687 | (2006.01) |

(52) U.S. Cl.
CPC .............. *H03K 3/013* (2013.01); *H03K 17/687* (2013.01)

(58) Field of Classification Search
CPC   H03K 3/013; H03K 3/356113; H03K 17/687
USPC ......... 327/108–112, 427, 434, 437, 383, 574, 327/379, 321; 326/82, 83, 84, 86; 375/257
See application file for complete search history.

(56) References Cited

U.S. PATENT DOCUMENTS

| | | | | |
|---|---|---|---|---|
| 7,956,653 B1* | 6/2011 | Choy | ...................... | H03F 3/217 326/83 |
| 2010/0277217 A1* | 11/2010 | Takarada | ....... | H03K 19/018592 327/419 |
| 2011/0182369 A1* | 7/2011 | Takarada | ............ | H04L 25/0272 375/257 |
| 2012/0268200 A1* | 10/2012 | Rossi | ............. | H03K 19/018521 327/574 |
| 2014/0312954 A1* | 10/2014 | Ghisu | .............. | H03K 3/356113 327/333 |

FOREIGN PATENT DOCUMENTS

JP       2004-230069 A       8/2004

* cited by examiner

*Primary Examiner* — Lincoln Donovan
*Assistant Examiner* — Thomas Skibinski
(74) *Attorney, Agent, or Firm* — Miles & Stockbridge P.C.

(57) ABSTRACT

Provided is a transmission drive circuit which can reduce distortions of a transmission signal and transmission noise, and is isolable from a signal line. A transmission drive circuit 700 includes a drive transistor 10 and an isolation diode 31 connected between a node n1 coupled to a signal line SL commonly used to propagate a transmission signal and a reception signal and a power source line HVP, and further includes an isolation diode 32 and a drive transistor 20 connected between the node n1 and a voltage line HVM. Furthermore, the transmission drive circuit 700 includes a switch 41 connected between a node n2 between the drive transistor 10 and the isolation diode 31, and a node n4 of a ground voltage Vs, and a switch 43 connected between a node n3 between the drive transistor 20 and the isolation diode 32, and a node n4. When the transmission signal is propagated through the signal line SL, the switches 41 and 43 are turned off by the clamp switch control circuit 200 such that bias current flows through the drive transistor 10, the isolation diode 31, the isolation diode 32 and the drive transistor 20.

6 Claims, 5 Drawing Sheets

TRANSMISSION DRIVE CIRCUIT AND SEMICONDUCTOR INTEGRATED CIRCUIT DEVICE

TECHNICAL FIELD

The present invention relates to a transmission drive circuit, particularly to a transmission drive circuit coupled to a signal line which is used to propagate a transmission signal and a reception signal, and for example, relates to a transmission drive circuit used for an ultrasonic diagnostic apparatus and a semiconductor integrated circuit device equipped with the same.

BACKGROUND ART

For example, in an ultrasonic diagnostic apparatus, in order to generate ultrasonic waves, the ultrasonic diagnostic apparatus supplies drive signals to a piezoelectric element which is called a probe and generates ultrasonic waves. Furthermore, the piezoelectric element converts the reflected waves to the generated ultrasonic waves into electrical signals, and the converted signals is supplied from the terminal of the piezoelectric element to the ultrasonic diagnostic apparatus. Therefore, the drive signals (transmission signals) and the converted signal (reception signals) are propagated through a signal line between the terminal of the piezoelectric element and the ultrasonic diagnostic apparatus. That is, the signal line is commonly used to propagate the transmission signals and reception signals.

PTL 1 discloses a transmission circuit provided in an ultrasonic diagnostic apparatus.

CITATION LIST

Patent Literature

PTL 1: JP 2004-230069 A

SUMMARY OF INVENTION

Technical Problem

An ultrasonic diagnostic apparatus is used for, for example, a medical purpose. In this case, in a medical ultrasonic diagnostic apparatus, ultrasonic waves are generated by applying electrical signals (drive signals) to a piezoelectric element called a probe, and the reflected waves reflected from a body are converted into electrical signals by a piezoelectric element, amplified, and imaged after performing signal processing. The drive signals and the signals obtained by the conversion are propagated through the same signal line in the probe. That is, the same signal line is used for transmission and reception.

Therefore, one end of the signal line is connected to the terminal of the piezoelectric element, and the other end of the signal line is connected to an output of the transmission drive circuit which transmits the drive signal and an input of the reception circuit which receives the signal obtained by the conversion. In this case, when the reception circuit receives the signal, it is preferable that the transmission drive circuit is isolated from the signal line. This is because when an output of the transmission drive circuit is connected to the signal line, output impedance of the transmission drive circuit is coupled to the signal line, whereby the reception signal to be received by the reception circuit deteriorates.

When the reception circuit receives the signal, in order to isolate the transmission drive circuit from the signal line, for example, a following configuration can be possible. That is, a pair of diodes connected so as to be a forward bias bidirectionally is connected in series between the output of the transmission drive circuit and the signal line. The drive signal which drives the piezoelectric element, that is, the drive signal output from the transmission drive circuit is a larger amplitude signal than the reception signal. Therefore, the large amplitude drive signal exceeds the barrier voltage of the diode and is propagated from the transmission drive circuit to the signal line. On the other hand, the small amplitude reception signal does not exceed the barrier voltage of the diode, and the reception signal in the signal line is not supplied to the transmission drive circuit. Thus, it is possible to isolate the transmission drive circuit from the signal line. Note that, the voltage of the drive signal rises or falls based on a predetermined voltage, for example, using a ground voltage as a reference voltage, and a bidirectional potential barrier is formed using a pair of diodes connected to be a forward bias bidirectionally.

However, when this configuration is adopted, during the voltage of the drive signal is lower than the potential barrier of the diode, the drive signal is not propagated to the signal line, and the transmission drive circuit is being isolated from the signal line, as is the case in the reception. In other words, a part of the drive signal is propagated to the signal line, and which causes the problem that the waveform of the drive signal (transmission signal) in the signal line is distorted.

Furthermore, PTL 1 discloses that an isolation circuit configured with diodes is provided between a pair of output transistors included in a transmission circuit. Bias current flows to the isolation circuit at transmission, whereby the transmission signal enables to pass through the isolation circuit. Alternatively, PTL 1 discloses that bias current to the isolation circuit is stopped at reception, whereby the transmission circuit is isolated from the signal line without distorting the signal to be transmitted.

However, PTL 1 discloses that the bias current to the isolation circuit is controlled by on/off control of the bias of the transmission circuit. Therefore, in an on/off transition process of the bias of the transmission circuit, a function to isolate transmission and reception is canceled, and transitional fluctuation associated with the on/off of the bias of the transmission circuit may be output as unintentional transmission noise.

Generally, the on/off transition of the bias of the transmission circuit (transmission drive circuit) takes some time. Therefore, it is required to control the time for the bias of transmission circuit to be turned on so that the time is set longer than the period during the transmission signal is actually output, and is set before and after the period during the transmission signal is actually output. Thus, a discrepancy between the period during the transmission signal is actually output and time to cancel the function to isolate transmission and reception may occur. In this discrepancy period, there is a problem that, for example, noise generated in the input signal line of the transmission circuit may be amplified and output from the transmission circuit to the signal line as unintentional transmission noise.

A purpose of the present invention is to provide a transmission drive circuit which can reduce distortions and transmission noise of a transmission signal, and is isolable from a signal line.

The above and other purposes, and novel features of the present invention will be understood from the description and the appended drawings of the present specification.

Solution to Problem

Among the inventions disclosed in the present application, an outline of the representative inventions is briefly described below.

That is, a transmission drive circuit including: a first node coupled to a signal line commonly used to propagate a transmission signal and a reception signal; a first drive transistor having a control terminal and a pair of terminals, a first voltage being supplied to a one terminal of the pair of terminals, current which flows between the pair of terminals varying according to voltage supplied to the control terminal; a first isolation diode having one terminal connected to the first node and another terminal connected to the other terminal of the first drive transistor; a second drive transistor having a control terminal and a pair of terminals, a second voltage being supplied to a one terminal of the pair of terminals, current which flows between the pair of terminals varying according to voltage supplied to the control terminal; and a second isolation diode having one terminal connected to the first node and another terminal connected to the other terminal of the second drive transistor.

Furthermore, the transmission drive circuit includes: a first switch connected between the other terminal of the first isolation diode and a predetermined voltage; a second switch connected between the other terminal of the second isolation diode and the predetermined voltage; a pre-stage circuit configured to supply, to each of the control terminals of the first drive transistor and the second drive transistor, an input signal according to a transmission signal to be propagated to the signal line; and a switch control circuit configured to control the first switch and the second switch.

Here, when a transmission signal is propagated to the signal line, the switch control circuit controls the first switch and the second switch in order for the predetermined voltage not to be supplied to each of the other terminals of the first isolation diode and the second isolation diode such that bias current flows through the first drive transistor, the second drive transistor, the first isolation diode, and the second isolation diode, and when a reception signal is propagated through the signal line, the switch control circuit controls the first switch and the second switch in order for the predetermined voltage to be supplied to each of the other terminals of the first isolation diode and the second isolation diode.

When a transmission signal is propagated to the signal line, each of the other terminals of the first isolation diode and the second isolation diode is isolated from the predetermined voltage, and the bias current flows through the first drive transistor, the second drive transistor, the first isolation diode, and the second isolation diode. Therefore, the transmission signal according to an input signal from the pre-stage circuit is propagated to the signal line. On the other hand, when a reception signal is propagated through the signal line, the predetermined voltage is supplied to each of the other terminals of the first isolation diode and the second isolation diode. By supplying the predetermined voltage to each of the other terminals of the first isolation diode and the second isolation diode, each of the first isolation diode and the second isolation diode isolates the transmission drive circuit from the signal line by each of the potential barriers.

When the transmission drive circuit propagates the transmission signal to the signal line, the first isolation diode and the second isolation diode are biased, and it is possible to reduce waveform distortions of the transmission signal. Furthermore, the switch control circuit controls to start/stop supplying the predetermined voltage to each of the other terminals of the first isolation diode and the second isolation diode, and it is possible to perform start/stop supplying at a timing when transmission noise is not generated.

Furthermore, in an embodiment, the transmission drive circuit including: a third switch connected between the control terminal of the first drive transistor and the predetermined voltage; and a fourth switch connected between the control terminal of the second drive transistor and the predetermined voltage. Here, when a transmission signal is propagated to the signal line, the switch control circuit controls the third switch and the fourth switch in order for the predetermined voltage not to be supplied to each of the control terminals of the first drive transistor and the second drive transistor, and when a reception signal is propagated through the signal line, the switch control circuit controls the third switch and the fourth switch in order for the predetermined voltage to be supplied to each of the control terminals of the first drive transistor and the second drive transistor.

When a reception signal is propagated through the signal line, by supplying the predetermined voltage to each control terminals of the first drive transistor and the second drive transistor, current which flows through the first drive transistor and the second drive transistor is reduced, and it is possible to reduce or block bias current to the first isolation diode and the second isolation diode, and reduce power consumption.

Advantageous Effects of Invention

In the inventions disclosed in the present application, effects obtained by the representative inventions are briefly described below.

It is possible to provide a transmission drive circuit which can reduce distortions and transmission noise of a transmission signal, and is isolable from a signal line.

DESCRIPTION OF EMBODIMENTS

Hereinafter, embodiments of the present invention will be described in detail based on the drawings. Note that, in all of the drawings to describe the embodiments, the same reference signs are assigned to the same parts, and the repeated description thereof will be basically omitted.

In the embodiments described below, a transmission drive circuit used for a medical ultrasonic diagnostic apparatus will be described as an example, but the embodiment is not limited to the example, and a transmission drive circuit is applicable to various electronic devices. Furthermore, a transmission drive circuit which supplies a drive signal (transmission signal) to a piezoelectric element generating ultrasonic waves is described as an example. In this case, the signal line connected to the terminal of the piezoelectric element is connected to an output of the transmission drive circuit and an input of the reception circuit. The transmission drive circuit transmits (propagates) a large amplitude signal to the signal line in a transmission period to drive the piezoelectric element. On the other hand, the reception circuit receives a small amplitude signal supplied (propagated) to the signal line from the piezoelectric element in a reception period. Furthermore, the voltage of the drive signal rises or falls based on a predetermined voltage, such as a ground voltage Vs, and changes, for example, in the maximum range of ±100 V.

First Embodiment

Figure 1:
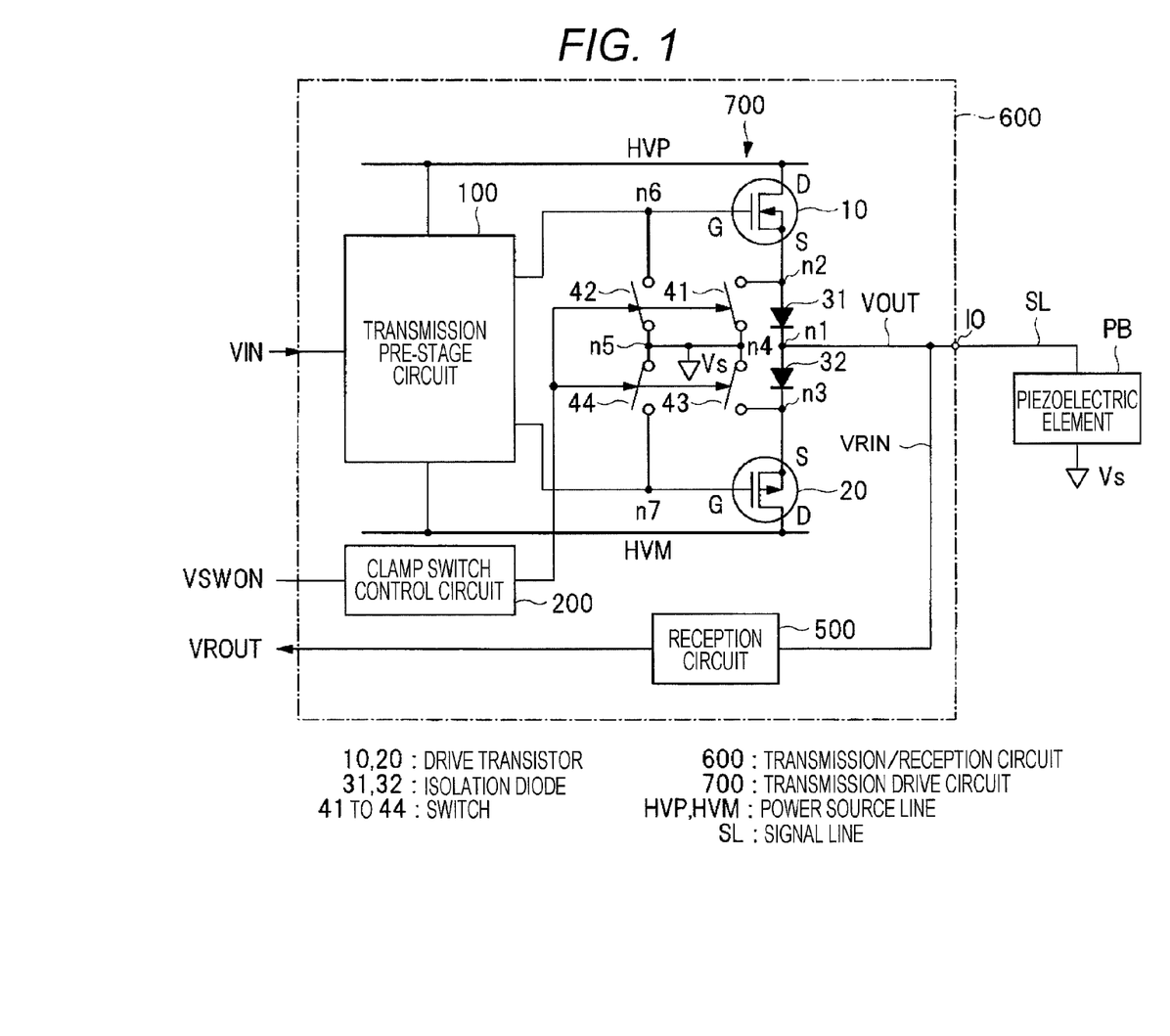
FIG. 1 is a block diagram showing a configuration of a transmission drive circuit according to a first embodiment.

FIG. 1 is a block diagram showing a configuration of a transmission drive circuit according to a first embodiment. FIG. 1 shows the transmission drive circuit and the related parts thereof. In the first embodiment, an example in which the transmission drive circuit and the reception circuit are included in a transmission/reception circuit is shown. In the drawing, the reference sign 600 denotes a transmission/reception circuit and includes a reception circuit 500 and transmission drive circuit 700. Furthermore, the transmission/reception circuit 600 is formed on a semiconductor substrate together with other circuit blocks (not shown) with a well-known semiconductor manufacturing technique, and called a semiconductor integrated circuit device. Furthermore, in the drawing, the reference sign PB denotes a piezoelectric element which generates ultrasonic waves in a transmission period and converts reflected waves into electrical signals in a reception period and includes, but not particularly limited to, a pair of terminals. A one terminal of the piezoelectric element PB is connected to a ground voltage Vs and the other terminal is electrically connected to a one end of a signal line SL. The transmission/reception circuit 600 includes an input/output terminal IO. The input/output terminal IO is electrically connected to the other end of the signal line SL. Note that, the input/output terminal IO of the transmission/reception circuit 600 may be regarded as an external input/output terminal provided in a semiconductor integrated circuit device.

In the transmission period, the transmission/reception circuit 600 receives a transmission input signal VIN from a circuit block (not shown) and supplies a large amplitude drive signal from the input/output terminal IO to the signal line SL. The drive signal supplied to the signal line SL is propagated through the signal line SL and supplied to the other terminal of the piezoelectric element PB. The piezoelectric element PB generates the ultrasonic waves according to the drive signal supplied to the other terminal.

In the reception period, the piezoelectric element PB receives and converts the reflected waves into the electrical signal and supplies the converted small amplitude signal to the signal line SL. The signal supplied to the signal line SL (reception signal) is propagated through the signal line SL and supplied to an input/output terminal IO of an transmission/reception circuit 600. The signal supplied to the input/output terminal IO of the transmission/reception circuit 600 is amplified in the reception circuit 500 and supplied to a circuit block (not shown) as a reception signal VROUT. The circuit block to which the reception signal VROUT is supplied processes the reception signal. The ultrasonic diagnostic apparatus generates and displays an image based on the reception signal VROUT. Furthermore, in FIG. 1, the reference sign VSWON denotes a switch control signal generated by a circuit block (not shown). The switch control signal VSWON, which will be described later, is a control signal designating whether or not to isolate the transmission drive circuit.

In FIG. 1, the transmission/reception circuit 600 is configured so as to correspond one to one to the piezoelectric element PB, but is not limited to this. In other words, a plurality of piezoelectric elements PB are prepared and, a high voltage switch circuit may be provided between each of the other terminals of the input/output terminal IO of the transmission/reception circuit 600 and the piezoelectric elements PB. In this case, by the high voltage switch circuit, any one of the other terminals of the piezoelectric elements PB is electrically connected to the commonly used input/output terminal IO of the transmission/reception circuit 600 via the signal line SL.

The reception circuit 500 has an input terminal connected to the input/output terminal IO of the transmission/reception circuit 600. The small amplitude signal propagated through the signal line SL and supplied from the piezoelectric element PB to the input/output terminal IO of the transmission/reception circuit 600 is supplied to the reception circuit 500 as an reception input signal VRIN. The reception circuit 500 is, but not particularly limited to, an analog front end circuit, performs processing, such as noise cancellation and amplification, to the reception input signal VRIN, and outputs a reception signal VROUT corresponding to the reception input signal VRIN.

The transmission drive circuit 700 includes a transmission pre-stage circuit (pre-stage circuit) 100, a clamp switch control circuit (switch control circuit) 200, power source lines HVP and HVM, switches 41 to 44, isolation diodes 31 and 32, transistors 10 and 20, and nodes n1 to n7. In the specification, an example in which a field effect transistor (hereinafter, referred to as a transistor) is used as transistors 10 and 20 will be described. The transistor 10 is an n-channel transistor, and the transistor 20 is a p-channel transistor. The transmission drive circuit 700 outputs, from the node n1, a drive signal VOUT (transmission signal) according to the transmission input signal VIN in the transmission period. The node n1 is connected to the input/output terminal IO of the transmission/reception circuit 600, and the drive signal VOUT is propagated via the input/output terminal IO and through the signal line SL, and supplied to the other terminal of the piezoelectric element PB in the transmission period.

Each of the transistors 10 and 20 is a drive transistor having a high voltage configuration to supply a large amplitude drive signal to the piezoelectric element PB. Each of the drive transistors 10 and 20 (a first drive transistor and a second drive transistor) has a gate terminal G, a source terminal S, a drain terminal D, and a body terminal. The source terminal S and the drain terminal D are regarded as a pair of terminals, and the current according to the voltage at the gate terminal G (control terminal) to the source terminal S flows between the pair of terminals. The body terminal corresponds to a semiconductor region in one semiconductor substrate on which the drive transistors 10 and 20 are formed. The conduction types of the drive transistors 10 and 20 are different from each other, and the semiconductor regions corresponding to the body terminals are the different conductive types of the semiconductor regions formed on the one semiconductor substrate. In this embodiment, each of the body terminals of the drive transistors 10 and 20 is, but not particularly limited to, connected to each of the source terminals S of the drive transistors.

The drain terminal D of the drive transistor 10 is connected to the power source line HVP (first voltage line), the source terminal S thereof is connected to the node n2, and the gate terminal G thereof is connected to the node n6. Furthermore, the drain terminal D of the drive transistor 20 is connected to the power source line HVM (second voltage line), the source terminal S thereof is connected to the node n3, and the gate terminal G thereof is connected to the node n7. The node n2 is connected to an anode (the other terminal of the first isolation diode) of the isolation diode 31 (first isolation diode), and the node n1 is connected to a cathode (the one terminal of the first isolation diode) of the isolation diode 31. Furthermore, the node n1 is connected to an anode (the one terminal of the second isolation diode) of the isolation diode 32 (second isolation diode), and the node n3 is connected to a cathode (the one terminal of the second isolation diode) of the isolation diode 32. In other words, the source terminal S of the n-channel drive transistor 10 is connected to the input/output terminal IO via the isolation diode 31, and the source terminal S of the p-channel drive transistor 20 is connected to the input/output terminal IO via the isolation diode 32.

The switch 41 (first switch) in which the on/off control is performed by the control signal from a clamp switch control circuit 200 is connected between the node n2 and the node n4 to which the ground voltage Vs is supplied, and the switch 43 (second switch) in which the on/off control is performed by the control signal from the clamp switch control circuit 200 is connected between the node n3 and the node n4. Furthermore, in this embodiment, the switch 42 (third switch) in which the on/off control is performed by the control signal from the clamp switch control circuit 200 is connected between the node n6 and the node n5 to which the ground voltage Vs is supplied, and the switch 44 (fourth switch) in which the on/off control is performed by the control signal from the clamp switch control circuit 200 is connected between the node n7 and the node n5.

The nodes n6 and n7 are connected to a transmission pre-stage circuit 100. The transmission pre-stage circuit 100 is connected to the power source lines HVP and HVM, and operates with the voltage of the power source lines HVP and HVM as an operating voltage. Here, the first voltage is supplied to the power source line HVP, and the second voltage is supplied to the power source line HVM. In this case, the first voltage is higher than the second voltage. The transmission pre-stage circuit 100 receives the transmission input signal VIN and outputs, to the nodes n6 and n7, the voltage according to the voltage of the transmission input signal VIN. In other words, the transmission pre-stage circuit 100 superimposes a predetermined first bias voltage to the drive transistor 10 on the voltage corresponding to the voltage of the transmission input signal VIN at the time, and supplies the superimposed voltage to the node n6. Furthermore, the transmission pre-stage circuit 100 superimposes a predetermined second bias voltage to the drive transistor 20 on the voltage corresponding to the voltage of the transmission input signal VIN at the time, and supplies the superimposed voltage to the node n7. In this embodiment, the bias voltages to each of the drive transistors 10 and 20, that is, the first bias voltage and the second bias voltage are different, and the transmission pre-stage circuit 100 separately outputs the signal to the nodes n6 and n7. Note that, each of the drive transistors 10 and 20 operates as a source follower circuit in the transmission period. Furthermore, the isolation diodes 31 and 32 are connected so as to be a forward bias when the bias current flows to each of the drive transistors 10 and 20.

The clamp switch control circuit 200 receives the switch control signal VSWON, generates the control signal according to the voltage of the switch control signal VSWON, and supplies the generated signal to the switches 41 to 44. In other words, on/off control of each of the switches 41 to 44 is performed by the switch control signal VSWON.

During the large amplitude drive signal VOUT (transmission signal) according to the transmission input signal VIN is supplied from the node n1 via the input/output terminal IO to the signal line SL, that is, in the transmission period, the switch control signal VSWON is set, for example, to a low level. Thus, the clamp switch control circuit 200 supplies, to the switches 41 to 44, the control signal to turn off each of the switches 41 to 44 (for example, low level).

Each of the switches 41 to 44 is turned off, whereby each of the nodes n2, n3, n6 and n7 is electrically isolated from the nodes n4 and n5 to both of which the ground voltage Vs (predetermined voltage) is supplied.

By the first bias voltage and the second bias voltage respectively supplied to the nodes n6 and n7 from the transmission pre-stage circuit 100, the bias current flows through the drive transistor 10, the isolation diodes 31 and 32, and the drive transistor 20. The current corresponding to the voltage of the transmission input signal VIN flows, so as to be superimposed on the bias current, through the drive transistor 10, the isolation diodes 31 and 32, and the drive transistor 20. Thus, the large amplitude drive signal VOUT corresponding to the transmission input signal VIN is generated at the node n1 and supplied to the signal line SL via the input/output terminal IO.

In the transmission period, the bias current which flows through the drive transistors 10 and 20 and the isolation diodes 31 and 32 is held regardless of the voltage of the drive signal VOUT. Therefore, by the isolation diodes 31 and 32, the transmission drive circuit 700 is not electrically isolated from the signal line SL, and it is possible to suppress generation of waveform distortions of the drive signal VOUT.

On the other hand, when the signal from the piezoelectric element PB is propagated through the signal line SL to the transmission/reception circuit 600, that is, in the reception period during the reception circuit 500 receives the reception input signal VRIN, the switch control signal VSWON is set, for example, to a high level. Thus, the clamp switch control circuit 200 generates the control signal to turn on each of the switches 41 to 44 and supplies the signal to the switches 41 to 44. By the control signal, when each of the switches 41 to 44 is turned on, each of the nodes n2, n3, n6 and n7 is electrically connected to the nodes n4 and n5 and is connected to the ground voltage Vs.

Each of the voltages at the nodes n2 and n3 is connected to the ground voltage Vs by the switches 41 and 43, whereby even if current flows between the terminals (between the source terminal S and the drain terminal D) of each of the drive transistors 10 and 20, the current flows to the ground voltage Vs. Thus, the current flowing to the isolation diodes 31 and 32 is blocked. Furthermore, at this time, the ground voltage Vs is supplied to the anode of the isolation diode 31 and the cathode of the isolation diode 32 via the switches 41 and 43. Therefore, the node n1 is electrically isolated from the node n2 (the source terminal S of the drive transistor 10) by the potential barrier of the isolation diode 31, and the node n1 is electrically isolated from the node n3 (the source terminal S of the drive transistor 20) by the potential barrier of the isolation diode 32.

In other words, the signal line SL connected to the node n1 via the input/output terminal IO is electrically isolated from the drive transistor by the potential barriers of the isolation diodes 31 and 32. Thus, in the reception period, it is possible to prevent the small amplitude reception signal Vin propagated through the signal line SL from being conveyed to the drive transistor.

When each of the switches 41 to 44 is turned on, the gate terminals G of the drive transistors 10 and 20 are connected to the ground voltage Vs by the switches 42 and 44, the bias current supplied to the isolation diodes 31 and 32 through the drive transistors 10 and 20 is blocked by the switches 41 and 43, and the drive transistors 10 and 20 are isolated from the transmission drive circuit 700 by the potential barriers of the isolation diodes 31 and 32.

In this embodiment, the nodes n6 and n7 are connected to the ground voltage Vs by the switches 42 and 44, and the ground voltage Vs is supplied to each of the gate terminals G of the drive transistors 10 and 20. At this time, since the ground voltage Vs is supplied to each of the source terminals S of the drive transistors 10 and 20 via the switches 41 and 43, the drive transistors 10 and 20 are in non-conductive state, and it is possible to reduce the current which flows between the source terminal S and the drain terminal D of each of the drive transistors 10 and 20. The driving capabilities of the drive transistors 10 and 20 are set high in order to drive the signal line SL, and it is effective in suppressing power consumption by reducing the current.

As described above, in this embodiment, the switch control circuit 200 controls the switches 41 to 44 independently from the bias of the drive transistors 10 and 20 by the transmission pre-stage circuit 100, whereby a transmission/reception isolation function by the isolation diodes 31 and 32 is controlled. Here, the transmission/reception isolation function means a function to electrically isolate the transmission drive circuit (drive transistor) from the reception circuit. Furthermore, enabled (on) state of the transmission/reception isolation function indicates that the transmission drive circuit (drive transistor) is isolated from the reception circuit, and disabled (off) state of the transmission/reception isolation function indicates that the transmission circuit is not isolated from the reception circuit. In other words, when the transmission/reception isolation function is enabled (on), each of the switches 41 to 44 in the first embodiment is turned on. Alternatively, when the transmission/reception isolation function is disabled (off), each of the switches 41 to 44 in the first embodiment is turned off. The switches 41 to 44 are turned on/off at an appropriate timing by the switch control circuit 200 separately from the bias of the drive transistors 10 and 20, whereby it is possible to enable/disable the transmission/reception isolation function at an appropriate timing.

Figure 2:
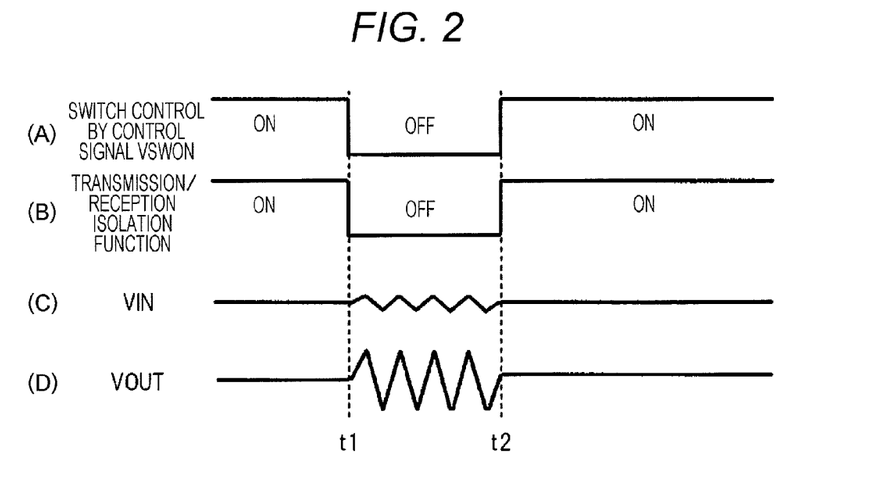
FIG. 2 shows waveform diagrams to describe the transmission drive circuit according to the first embodiment.

FIG. 2 shows waveform diagrams for the operation of the transmission drive circuit 700 according to the first embodiment. In FIG. 2, the abscissa axis indicates the time. waveform (A) shows the control of the switches 41 to 44 by the switch control signal VSWON, and waveform (B) shows the on/off (enabled/disabled) of the transmission/reception isolation function. Furthermore, waveform (C) shows the waveform of the transmission input signal VIN, and waveform (D) shows the waveform of the drive signal VOUT.

Generally, the on/off control of a switch can be quickly performed. In other words, the time for the state of each of the switches 41 to 44 to be changed after the voltage of the switch control signal VSWON is changed (from a high level to a low level or from a low level to a high level) is short. Therefore, as shown in waveform (A), when the switch control signal VSWON instructs to change the on/off of the switches 41 to 44, the on/off state of the switches 41 to 44 is changed in a short time in response to the instruction. Thus, as shown in waveform (B), the on/off (enabled/disabled) of the transmission/reception isolation function is changed in a short time in response to the instruction of the switch control signal VSWON waveform (A)).

Therefore, as shown in waveform (C), it is possible to turn off the switches 41 to 44 by the switch control signal VSWON in accordance with the timing t1 when the transmission input signal VIN is supplied to the transmission pre-stage circuit 100, or the timing t1 when the drive signal VOUT corresponding to the transmission input signal VIN is supplied to the signal line SL. Furthermore, it is possible to turn on the switches 41 to 44 by the switch control signal VSWON in accordance with the timing t2 after the drive signal VOUT has been supplied to the signal line SL. Thus, it is possible to match the period during the drive signal VOUT is propagated to the signal line SL and the period during the transmission/reception isolation function is turned off.

Furthermore, in this embodiment, the first bias voltage and the second bias voltage are supplied from the transmission pre-stage circuit 100 to the nodes n6 and n7 regardless of the state of the switches 41 to 44. In other words, before and after the transmission/reception isolation function is turned on/off, the bias state of the transmission pre-stage circuit 100 is maintained, and it is possible to more reliably match the supplying period of the drive signal VOUT and the connected/isolated state by the transmission/reception isolation function.

Figure 3:
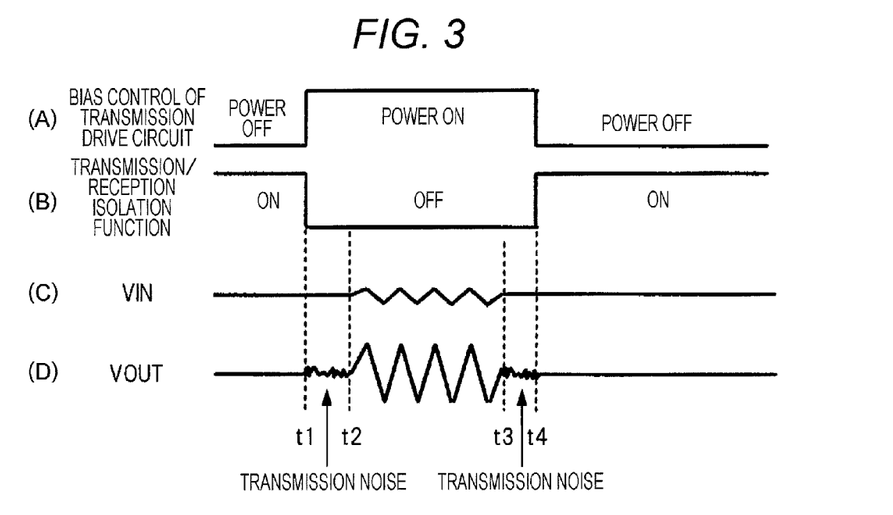
FIG. 3 shows waveform diagrams to describe an effect of the transmission drive circuit according to the first embodiment.

FIG. 3 shows waveforms when the bias current to an isolation circuit is controlled by the on/off of the bias of the transmission circuit as described, for example, in PTL 1. Here, waveform (A) shows the bias control of the transmission circuit, and waveform (B) shows the on/off of the transmission/reception isolation function. Furthermore, waveform (C) shows a waveform of the transmission input signal VIN, and waveform (D) shows a waveform of the drive signal VOUT propagated from the transmission circuit to the signal line SL.

In FIG. 3, when the bias of the transmission circuit is turned on (powered on) at the time t1, the transmission/reception isolation function is changed from on to off at the time t1. Thus, the isolation of the transmission circuit from the signal line is released. However, it takes a time for the transmission circuit to reach a stable state, and transmission noise may be propagated from the transmission circuit to the signal line SL before transmission circuit has been stable at the time t2. Furthermore, when the bias of the transmission circuit is turned off (powered off), it takes a time for the transmission circuit to reach a stable state. In other words, when the bias of the transmission circuit is powered off at the time t3, the transmission circuit may propagate transmission noise to the signal line SL until the time t4 when the transmission circuit has been in a stable state. Note that, waveform (A) shows that the bias of the transmission circuit is powered off not at the time t3 but at the time t4, but actually, the bias of the transmission circuit is powered off at the time t3. This is because that the bias of the transmission circuit appears to be powered off at the time t4, so that the transmission/reception isolation function is turned on at the time t4.

In this embodiment, as shown in FIG. 2, it is possible to prevent transmission noise from being propagated to the signal line SL.

In FIG. 2, it has been described that the transmission pre-stage circuit 100 supplies the first bias voltage and the second bias voltage to the nodes n6 and n7 regardless of the state of the switches 41 to 44. However, the bias of transmission pre-stage circuit 100 may be controlled in the reception period. In other words, the bias of transmission pre-stage circuit 100 may be changed in the period when the transmission/reception isolation function is turned on (enabled).

Figure 4:
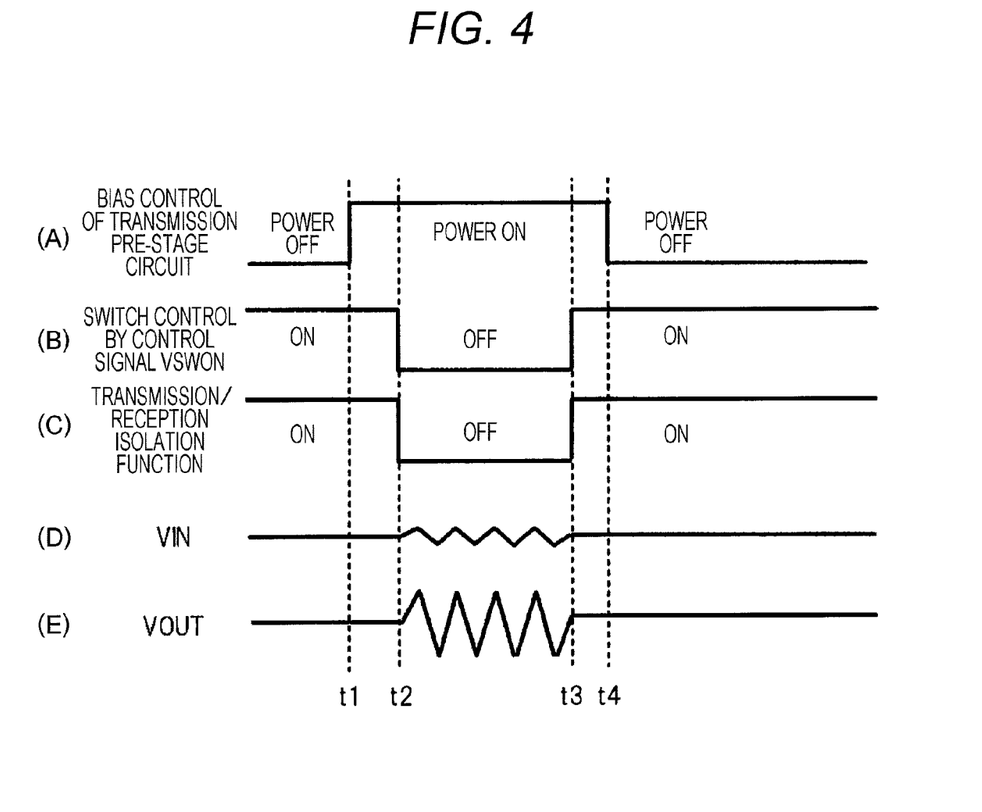
FIG. 4 shows waveform diagrams to describe other operation of the transmission drive circuit according to the first embodiment.

FIG. 4 shows waveform diagrams for other operation of the transmission drive circuit 700 according to the first embodiment. The drawing shows waveforms when the bias of the transmission pre-stage circuit 100 is controlled in the reception period. Waveform (A) is a waveform diagram showing bias control of the transmission pre-stage circuit 100. The period denoted by "power off" indicates the period during the power supply to the transmission pre-stage circuit 100 is stopped, and the period denoted by "power on" (from time t1 to t4) indicates the period during the power supply is performed. The control to start/stop supplying the power to the transmission pre-stage circuit 100 can be implemented, for example, by providing power source switches between the power source line HVP and the transmission pre-stage circuit 100, and between the power source line HVM and the transmission pre-stage circuit 100. In this case, during the "power on", the power source switch is turned on, and the operating voltage is supplied from the power source lines HVP and HVM to the transmission pre-stage circuit 100. On the other hand, during the "power off", the power source switch is turned off, and the operating voltage is not supplied to transmission pre-stage circuit 100. Needless to say, this is merely an example, and the embodiment is not limited to the example.

Waveforms (B) to (E) in FIG. 4 respectively correspond to waveforms (A) to (D) in FIG. 2, and the descriptions thereof are omitted. The margin period (periods from the time t1 to the time t2, and from the time t3 to the time t4) is provided between the bias control timing of the transmission pre-stage circuit 100 (the timing to change the circuit from "power off" to "power on" and the timing to change the circuit from "power on" to "power off") and the timing of the on/off control of each of the switches 41 to 44. Furthermore, the bias control of the transmission pre-stage circuit 100 is performed during the transmission/reception isolation function is turned on. Thus, in the margin time (the time t1 to the time t2) before the transmission/reception isolation function is changed from on to off, and in the margin time (the time t3 to the time t4) after the transmission/reception isolation function is changed from off to on, it is possible for the transmission pre-stage circuit 100 to transit to a stable state. Consequently, as described FIG. 2, it is possible to reduce generation of transmission noise at a transmission/reception switching time. Furthermore, the transmission pre-stage circuit 100 is powered off in this manner, whereby it is possible to reduce power consumption.

Second Embodiment

Figure 5:
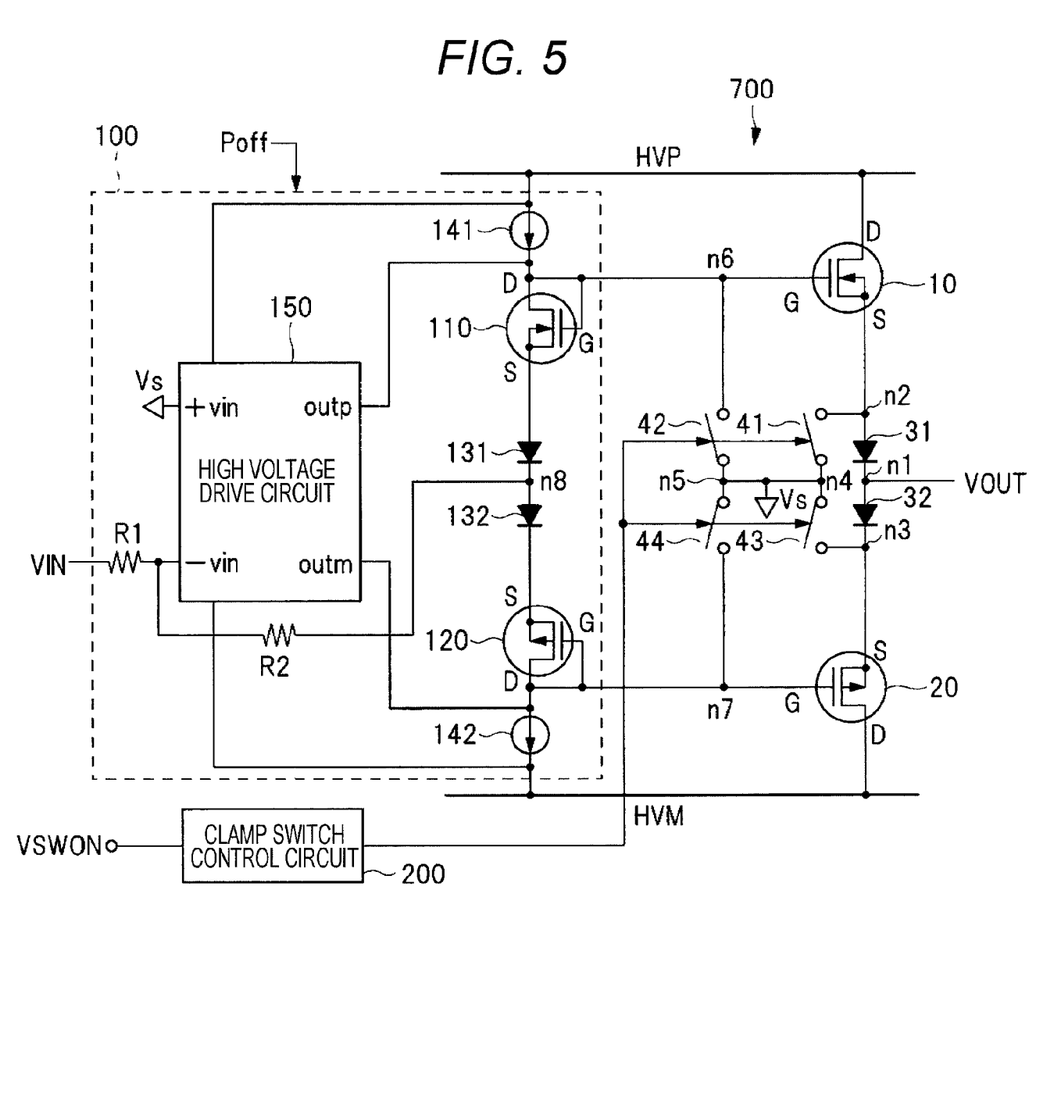
FIG. 5 is a block diagram showing a configuration of a transmission drive circuit according to a second embodiment.

FIG. 5 is a block diagram showing a configuration of a transmission drive circuit according to a second embodiment. A transmission drive circuit 700 according to the second embodiment is similar to the transmission drive circuit shown in FIG. 1, and differences will be mainly described here. Furthermore, in FIG. 5, a reception circuit 500, a signal line SL, and a piezoelectric element PB shown in FIG. 1 are omitted, but it is assumed that these are provided similarly to FIG. 1.

In the second embodiment, a configuration of a transmission pre-stage circuit 100, which is shown as a block in the first embodiment, is shown in detail. The configuration of the transmission drive circuit 700 shown in FIG. 5 is the same as transmission drive circuit shown in FIG. 1, except for the transmission pre-stage circuit 100, and the transmission pre-stage circuit 100 will be mainly described here with reference to FIG. 5.

The transmission pre-stage circuit 100 is a linear amplifier circuit and includes an n-channel transistor 110, a p-channel transistor 120, isolation diodes 131 and 132, current sources 141 and 142, resistances R1 and R2, and a high voltage drive circuit 150. Note that, each of the n-channel transistor 110 and the p-channel transistor 120 has a gate terminal G, a drain terminal D, a source terminal S, and a body terminal similarly to the above described transistors 10 and 20, and the source terminal S is connected to the body terminal.

The gate terminal G of the n-channel transistor 110 is connected to the drain terminal D thereof and a node n6. Furthermore, the drain terminal D of the n-channel transistor is connected to a power source line HVP via the current source 141, and the source terminal S thereof is connected to a node n8 via the isolation diode 131. The gate terminal G of the p-channel transistor 120 is connected to the drain terminal D thereof and a node n7. Furthermore, the drain terminal D of the p-channel transistor 120 is connected to a power source line HVM via the current source 142, and the source terminal S thereof is connected to the node n8 via the isolation diode 132.

The isolation diodes 131 and 132 have the similar characteristics to the above described isolation diodes 31 and 32. Furthermore, the n-channel transistor 110 and the p-channel transistor 120 have the similar characteristics, but are different in sizes, to the above described n-channel drive transistor 10 and p-channel drive transistor 20. The gate terminal G of the n-channel transistor 110 is connected to the node n6, and the gate terminal G of the p-channel transistor 120 is connected to the node n7. Therefore, the transistors 110 and 120, and the isolation diodes 131 and 132 which are connected in series between the power source lines HVP and HVM operate as a replica of the drive transistors 10 and 20, and the isolation diodes 31 and 32 which are connected in series between the power source lines HVP and HVM. In other words, the current which flows through the series circuit for driving configured with the drive transistors 10 and 20, and the isolation diodes 31 and 32 is proportional to the current which flows through the series circuit for replica configured with the transistor 110 and 120, and the isolation diodes 131 and 132. In this case, the node n8 of the series circuit for replica corresponds to the node n1 of the series circuit for driving, and the voltage in proportion to the voltage at the node n1 is generated at the node n8.

The series circuit for replica is biased by the current supplied from the current sources 141 and 142. In other words, the bias current is supplied from the current source 141 to the series circuit for replica, and the bias current is drawn from the series circuit for replica by the current source 142. In this embodiment, when a transmission input signal VIN is 0 V, the series circuit for replica is biased by the current sources 141 and 142, and the current source, the transistor, and the isolation diode are set so that the bias current flows through the series circuit for replica. The bias current flows through the series circuit for replica, whereby the bias current flows through the series circuit for driving. Thus, when the transmission input signal VIN is 0 V, it is guaranteed that the bias is applied, for example the bias current flows, to the drive transistor 10, 20 and the isolation diodes 31 and 32. As a result, in the transmission period, even when the voltage of a drive signal VOUT corresponding to the low transmission input signal VIN is lower than the potential barriers of the isolation diodes 31 and 32, the isolation by the isolation diodes 31 and 32 is not performed, and the drive signal VOUT of the waveform corresponding to the waveform of the transmission input signal VIN is output.

The high voltage drive circuit 150 has a positive phase input terminal +vin, a negative phase input terminal −vin, and output terminals outp and outm, and operates using the voltage from the power source lines HVP and HVM as the operating voltage. In other words, the high voltage drive circuit 150 amplifies the differential voltage between the positive phase input terminal +vin and the negative phase input terminal −vin and outputs the amplified signal from the output terminals outp and outm. In this embodiment, the positive phase input terminal +vin of the high voltage drive circuit 150 is connected to a ground voltage Vs, and the negative phase input terminal −vin is connected to the node n8 via the resistance R2. Furthermore, the transmission input signal VIN is supplied to the negative phase input terminal −vin via the resistance R1. The amplification gain of the high voltage drive circuit 150 is determined by a ratio of the resistance R2 to the resistance R1 (R2/R1). In other words, a negative feedback control inverting amplifier is configured with the high voltage drive circuit 150, the transistors 110 and 120, the isolation diodes 131 and 132, and the resistances R1 and R2, and the gain of the amplifier is represented as the resistance ratio R2/R1. Therefore, the voltage at the node n8 equals to the product of the voltage of the transmission input signal VIN and the resistance ratio R2/R1.

For example, when the voltage relation of the positive phase input terminal +vin and the negative phase input terminal −vin becomes +vin>−vin, the output terminal outp is driven to the power source line HVP. On the other hand, when the voltage relation becomes +vin<−vin, the output terminal outm is driven to the power source line HVM. The change of the output terminals outp and outm is propagated to the gate terminals G of the drive transistors 10 and 20, and the voltage at the node n1 is determined. In this case, the voltage at the node n1 is proportional to the voltage at the node n8. Therefore, the signal obtained by amplifying the transmission input signal VIN is supplied from the node n1 to the signal line SL as the drive signal VOUT.

In FIG. 5, Poff indicates a power control signal which performs the bias control of the transmission pre-stage circuit 100. The bias control of the transmission pre-stage circuit has been described before with reference to FIG. 4. In the above description with reference to FIG. 4, it has been described as an example that the power source switches are provided between the transmission pre-stage circuit 100 and the power source line HVP, and between the transmission pre-stage circuit 100 and the power source line HVM. On the other hand in the second embodiment, the current sources 141 and 142 are controlled by the power control signal Poff. For example, when the power control signal Poff is at a high level, each of the current sources 141 and 142 supplies the current, and when the power control signal Poff is at a low level, each of the current sources 141 and 142 stops supplying the current. With the configurations of the current sources 141 and 142, the power control signal Poff is changed as shown in waveform (A) in FIG. 4. Thus, during the transmission/reception isolation function is turned on, the current sources 141 and 142 start and stop supplying the current. As a result, during the transmission/reception isolation function is turned on, it is possible to control (start/stop) supplying the bias to the drive transistors 10 and 20, and the isolation diodes 31 and 32.

Furthermore, the power control signal Poff may control not the current sources 141 and 142 but the high voltage drive circuit 150. In other words, during the transmission/reception isolation function is turned on, the power control signal Poff may control the operation/non-operation of the high voltage drive circuit.

Third Embodiment

Figure 6:
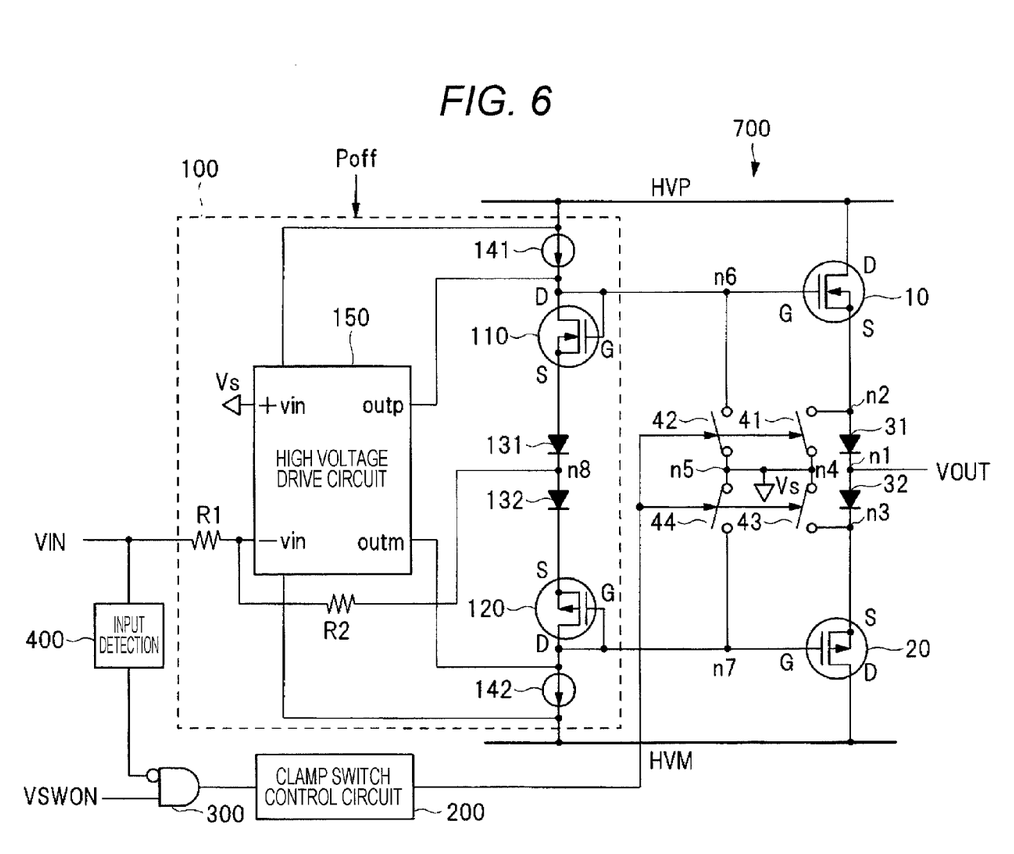
FIG. 6 is a block diagram showing a configuration of a transmission drive circuit according to a third embodiment.

FIG. 6 is a block diagram showing a configuration of a transmission drive circuit according to a third embodiment. A transmission drive circuit 700 according to the third embodiment is similar to the transmission drive circuit according to the second embodiment. Therefore, the differences will be mainly described here.

As compared to the transmission drive circuit shown in FIG. 5, the transmission drive circuit 700 shown in FIG. 6 further includes a logic circuit 300 (suppression circuit) and an input detection circuit 400.

A transmission input signal VIN is supplied to the input detection circuit 400. The input detection circuit 400 detects whether or not the transmission input signal VIN is supplied. When detecting that the transmission input signal VIN is supplied, the input detection circuit 400 outputs, for example, a high level detection result signal. The logic circuit 300 includes an inverter which inverts the phase of the detection result signal and an AND circuit which calculates a logical AND (logical product) of the output signal of the inverter and a switch control signal VSWON. Note that, in the drawing, the inverter is shown with "○" on the input side of the AND circuit.

In the third embodiment, a clamp switch control circuit 200 receives not the switch control signal VSWON but the output of the logic circuit 300. When the detection result signal from the detection circuit is low level and the switch control signal VSWON is high level, the logic circuit 300 supplies the high level signal to the clamp switch control circuit 200. On the other hand, as described in the first embodiment, the clamp switch control circuit 200 generates the control signals to turn on switches 41 to 44 when the high level signal is supplied, and to turn off the switches 41 to 44 when the low level signal is supplied.

Although the switch control signal VSWON is at the high level, the detection result signal from the input detection circuit 400 becomes the high level, whereby the logic circuit 300 supplies the low level signal to the clamp switch control circuit 200. Therefore, when the input detection circuit 400 detects the input signal, each of the switches 41 to 44 is turned off regardless of the control by the switch control signal VSWON. Thus, for example, in the transmission period, when the switch control signal VSWON is wrongly set to on, it is possible to avoid conflict between the drive transistors 10 and 20, and the switches 41 and 43. By avoiding the conflict, it is possible to prevent the current which flows through the drive transistors 10 and 20 from increasing or the drive transistors 10 and 20 from being damaged.

The configurations shown in FIG. 1, FIG. 5, and FIG. 6 are examples, and the embodiments are not limited to the examples. For example, a pulser circuit whose output signal changes rectangular, may be used instead of a linear amplifier as the transmission pre-stage circuit 100. Furthermore, the drive transistors 10 and 20, and the transistors 110 and 120 are not limited to the MOSFET, and can be replaced with a device which has a similar function, such as a bipolar transistor.

As described in the first to third embodiments, the transmission drive circuit 700 and/or the transmission/reception circuit 600 including the transmission drive circuit 700 are/is, but not limited to, one semiconductor integrated circuit device, and may be configured with independent elements. Moreover, the transmission drive circuit 700 and the reception circuit 500 are formed on independent semiconductor substrates, and these semiconductor substrates are mounted on a substrate, whereby the transmission drive circuit 700 and the reception circuit 500 may be a multichip module. In this case, the multichip module is regarded as the semiconductor integrated circuit device. The transmission drive circuit 700 and the reception circuit 500 are formed on the independent semiconductor substrates in this manner, whereby it is possible to form the transmission drive circuit 700 and the reception circuit 500 using a semiconductor manufacturing technique suitable for each of them.

In the above descriptions, the invention made by the inventors has been concretely described according to the embodiments. However, the present invention is not limited to the embodiments, and it is needless to say that various modifications can be made within the scope of the gist.

REFERENCE SIGNS LIST 10, 20 drive transistor
110, 120 transistor
31, 32, 131, 132 isolation diode
41 to 44 switch
100 transmission pre-stage circuit
141, 142 current source
150 high voltage drive circuit
200 clamp switch control circuit
300 logic circuit
400 input detection circuit
500 reception circuit
600 transmission/reception circuit
700 transmission drive circuit
HVP, HVM power source line
VIN transmission input signal
VSWON switch control signal
VOUT drive signal
VRIN reception input signal
VROUT reception signal
n1 to n8 node

The invention claimed is:

1. A transmission drive circuit comprising:
    a first node coupled to a signal line commonly used to propagate a transmission signal and a reception signal;
    a first drive transistor having a control terminal and a pair of terminals, where a first voltage being supplied to a one terminal of said pair of terminals, and in which the current flows between said pair of terminals varying according to voltage supplied to the control terminal;
    a first isolation diode having one terminal connected to the said first node and another terminal connected to the other terminal of the said first drive transistor;
    a second drive transistor having a control terminal and a pair of terminals, where a second voltage different from said first voltage being supplied to a one terminal of said pair of terminals, and in which the current flows between said pair of terminals varying according to voltage supplied to the control terminal;
    a second isolation diode having one terminal connected to said first node and another terminal connected to the other terminal of said second drive transistor;
    a first switch connected between the other terminal of said first isolation diode and a predetermined voltage;
    a second switch connected between the other terminal of said second isolation diode and the predetermined voltage;
    a pre-stage circuit configured to supply, to each of the control terminals of said first drive transistor and said second drive transistor, an input signal according to a transmission signal to be propagated to said signal line; and
    a switch control circuit configured to control said first switch and said second switch, wherein
    when a transmission signal is propagated to said signal line, said switch control circuit controls said first switch and said second switch in order for said predetermined voltage not to be supplied to each of the other terminals of said first isolation diode and said second isolation diode such that bias current flows through said first drive transistor, said second drive transistor, said first isolation diode, and said second isolation diode, and
    when a reception signal is propagated through said signal line, said switch control circuit controls said first switch and said second switch in order for said predetermined voltage to be supplied to each of the other terminals of said first isolation diode and said second isolation diode.

2. The transmission drive circuit according to claim 1, further comprising:
    a third switch connected between the control terminal of said first drive transistor and said predetermined voltage; and
    a fourth switch connected between the control terminal of said second drive transistor and said predetermined voltage, wherein
    when a transmission signal is propagated to said signal line, said switch control circuit controls said third switch and said fourth switch in order for said predetermined voltage not to be supplied to each of the control terminals of said first drive transistor and said second drive transistor, and
    when a reception signal is propagated through said signal line, said switch control circuit controls said third switch and said fourth switch in order for said predetermined voltage to be supplied to each of the control terminals of said first drive transistor and said second drive transistor.

3. The transmission drive circuit according to claim 2, wherein when current flows from said first voltage to said second voltage via the pair of terminals of said first drive transistor and the pair of terminals of said second drive transistor, each of said first isolation diode and said second isolation diode is connected so as to be a forward bias.

4. The transmission drive circuit according to claim 3, wherein said pre-stage circuit is a linear amplifier circuit.

5. The transmission drive circuit according to claim 4, further comprising:
    a detection circuit configured to detect a transmission signal to be propagated to said signal line; and
    a suppression circuit configured to receive a control signal supplied to said switch control circuit and a detection result signal of said detection circuit, and configured to, when a transmission signal is propagated to said signal line, suppress control to said first switch, said second switch, said third switch, and said fourth switch by said switch control circuit in order for said predetermined voltage not to be supplied to each of the control terminals and each of the other terminals of said first drive transistor and said second drive transistor.

6. A semiconductor integrated circuit device comprising one semiconductor substrate on which the transmission drive circuit according to claim 5 and a reception circuit configured to receive a reception signal propagated through said signal line are formed.

* * * * *